(12) United States Patent
Horiuchi et al.

(10) Patent No.: US 6,858,880 B2
(45) Date of Patent: Feb. 22, 2005

(54) LIGHT EMITTING DIODE DEVICE

(75) Inventors: Megumi Horiuchi, Yamanashi-ken (JP);
Shinobu Nakamura, Yamanashi-ken (JP)

(73) Assignees: Citizen Electronics Co., Ltd., Fujiyoshida (JP); Kawaguchiko Seimitsu Co., Ltd., Yamanashi-ken (JP)

( * ) Notice: Subject to any disclaimer, the term of this patent is extended or adjusted under 35 U.S.C. 154(b) by 21 days.

(21) Appl. No.: 10/298,683

(22) Filed: Nov. 19, 2002

(65) Prior Publication Data
US 2003/0094622 A1 May 22, 2003

(30) Foreign Application Priority Data
Nov. 22, 2001 (JP) ........................................ 2001-358460

(51) Int. Cl.[7] .............................................. H01L 33/00
(52) U.S. Cl. .......................... 257/100; 257/98; 257/99; 257/433; 257/434; 257/680

(58) Field of Search .......................... 257/100, 99, 433, 257/434, 680, 98

(56) References Cited

U.S. PATENT DOCUMENTS

| | | | | |
|---|---|---|---|---|
| 6,452,217 B1 | * | 9/2002 | Wojnarowski et al. | ......... 257/99 |
| 6,459,130 B1 | * | 10/2002 | Arndt et al. | ................. 257/432 |
| 6,507,049 B1 | * | 1/2003 | Yeager et al. | ............... 257/100 |
| 6,552,368 B2 | * | 4/2003 | Tamai et al. | ................... 257/98 |

* cited by examiner

*Primary Examiner*—Nathan J. Flynn
*Assistant Examiner*—Remmon R. Fordé
(74) *Attorney, Agent, or Firm*—Dennison, Schultz, Dougherty & MacDonald

(57) ABSTRACT

A recess is formed in a substrate, a pair of electrodes is provided on the surface of the substrate including a surface of the recess. An LED is provided on the bottom of the recess. A transparent sealing plate is provided for closing the recess.

5 Claims, 2 Drawing Sheets

LIGHT EMITTING DIODE DEVICE

BACKGROUND OF THE INVENTION

The present invention relates to a light emitting diode (LED) device used in electronic devices such as a portable telephone.

FIG. 4 is a sectional view of a conventional LED device. The LED device 15 comprises a substrate 25, a frame 18 made of resin and having a semispherical recess 19, electrodes 17a and 17b embedded in the substrate 18, and an LED 16 secured to the electrode 17a. The LED 16 is connected to the electrodes 17a and 17b by lead wires 20. The inside wall 22 of the recess 19 is processed into a light reflection surface 22. The recess 19 is charged with a transparent resin 21 to seal the LED.

In the LED device 15, if moisture remains in the transparent resin 21, the frame 18 is cracked by expansion of the moisture caused by the heat of the reflow soldering. Furthermore, the transparent resin 21 contracts in dependency on the change of the atmospheric temperature. If the change repeats, lead wires 20 may be cut, which results in unreliableness of the device.

SUMMARY OF THE INVENTION

An object of the present invention is to provide an LED device having reliableness.

According to the present invention, there is provided a light emitting diode device comprising a substrate, a recess formed in the substrate, a pair of electrodes provided on a surface of the substrate including a surface of the recess, an LED provided on a bottom of the recess, connecting means for connecting the LED with the electrodes, a sealing resin for sealing the connecting means, a transparent sealing plate for closing the recess.

The recess is formed into a semispherical shape.

The surface of each of the electrodes in the recess is formed into a light reflecting surface.

The sealing plate has a convex lens.

These and other objects and features of the present invention will become more apparent from the following detailed description with reference to the accompanying drawings.

DETAILED DESCRIPTION OF THE PREFERRED EMBODIMENT

Figure 1:
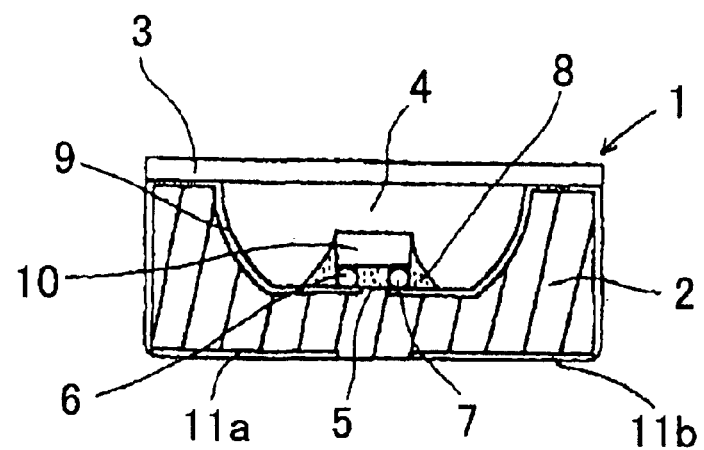
FIG. 1 is a sectional view of a first embodiment of the present invention.

Referring to FIG. 1, showing the first embodiment of the present invention, an LED device 1 comprises a substrate 2, made of a liquid crystal polymer and having a semispherical recess 4 electrodes 11a and 11b, and an LED 10 secured to the electrodes 11a, 11b by bumps 6 and 7. The inside wall of the recess 4 is coated with the electrodes 11a, 11b, and the surface of each electrode is processed into a light reflection surface 9 by silver plating. The underside of the LED 10 is sealed by a sealing resin 5 to increase resistance to moisture, shock and vibration, and to protect the bumps 6 and 7.

The recess 4 is closed by a transparent sealing plate 3 to protect the LED 10.

The liquid crystal polymer forming the substrate 2 has high resistance to heat and a small coefficient of expansion. Therefore, it is possible to reduce the influence of the heat of the reflow soldering and the change of atmospheric temperature.

Figure 2:
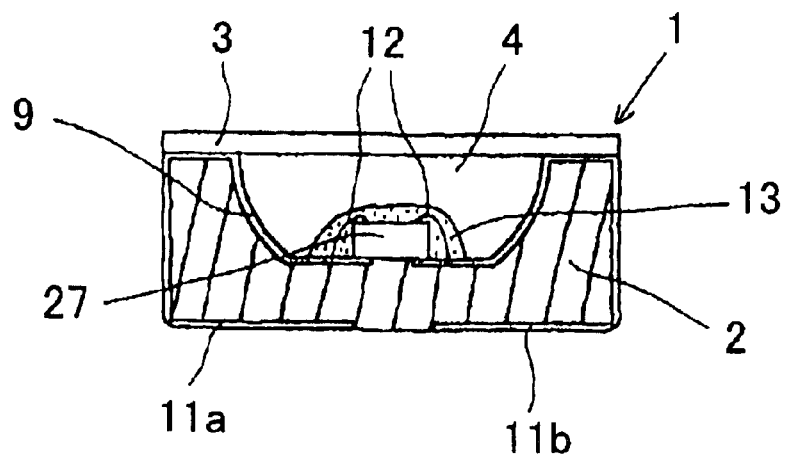
FIG. 2 is a sectional view of a second embodiment of the present invention.

Referring to FIG. 2 showing the second embodiment, an LED 27 is secured to the electrodes 11a and 11b, and connected to the electrodes by lead wires 12. The LED 27 and the lead wires 12 are sealed by a transparent resin 13 to protect the wires from cutting. Since the thickness of the resin 13 is small, the change of the atmospheric temperature has no influence on the resin 13 and the lead wires 12.

Other portions are the same as the first embodiment and identified by the same reference numerals thereof.

Figure 3:
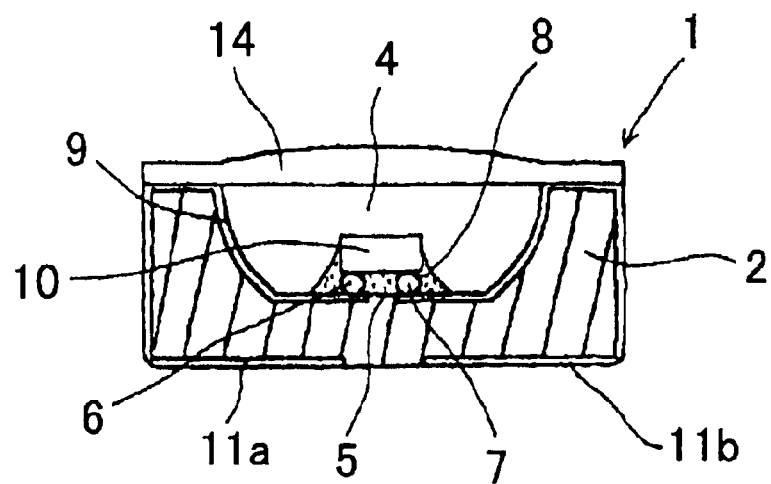
FIG. 3 is a sectional view of a third embodiment of the present invention.
Figure 4:
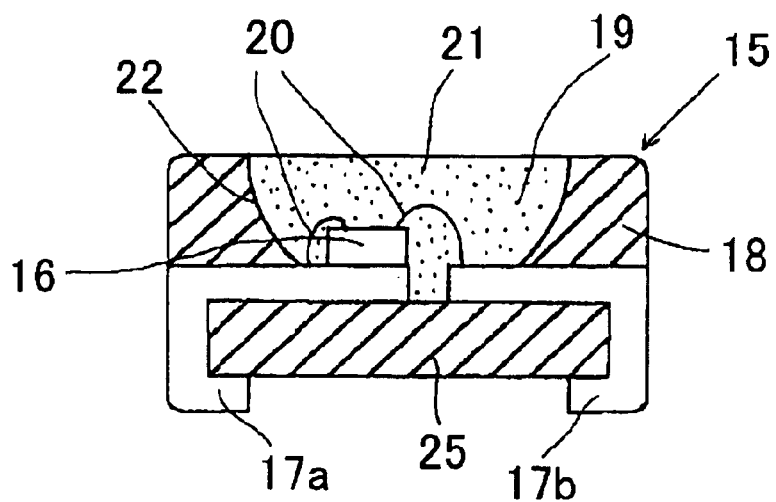
FIG. 4 is a sectional view of a conventional LED device.

Referring to FIG. 3 showing the third embodiment, there is provided a sealing plate 14 having a convex lens shape instead of the flat sealing plate 3 of the first embodiment of FIG. 1.

In accordance with the present invention, since the recess in which the LED is mounted is not charged with resin, the substrate and lead wires do not break by outside heat.

While the invention has been described in conjunction with preferred specific embodiment thereof, it will be understood that this description is intended to illustrate and not limit the scope of the invention, which is defined by the following claims.

What is claimed is:

1. A light emitting diode device comprising:
   a substrate;
   a recess formed in the substrate;
   a pair of electrodes provided on a surface of the substrate including a surface of the recess;
   an LED provided on a bottom of the recess;
   connecting means for connecting the LED with the electrodes;
   a sealing resin for sealing the connecting means; and
   a transparent sealing plate for closing the recess, forming an air space in the recess.

2. The device according to claim 1 wherein the recess is formed into a semispherical shape.

3. The device according to claim 1 wherein the surface of each of the electrodes in the recess is formed into a light reflecting surface.

4. The device according to claim 1 wherein the sealing plate-has a convex lens.

5. The device according to claim 1 wherein the substrate is made of liquid crystal polymer.

* * * * *